United States Patent
Bollinger et al.

[11] Patent Number: 6,140,222
[45] Date of Patent: *Oct. 31, 2000

[54] INTEGRATED CIRCUIT DIELECTRIC FORMATION

[75] Inventors: Cheryl Anne Bollinger, Kutztown; Catherine Ann Fieber, Emmaus; Kurt George Steiner, Bethlehem, all of Pa.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/506,253

[22] Filed: Jul. 21, 1995

Related U.S. Application Data

[63] Continuation of application No. 08/320,309, Oct. 11, 1994, abandoned, which is a continuation of application No. 07/949,417, Sep. 22, 1992, abandoned.

[51] Int. Cl.[7] .................... H01L 21/3115; H01L 21/28

[52] U.S. Cl. .................... 438/623; 438/624; 438/626; 438/627; 438/783

[58] Field of Search .................... 257/760, 637, 257/642, 644; 437/235, 236, 238, 240, 978; 148/DIG. 81, DIG. 118; 438/623, 624, 626, 627, 783, FOR 355, FOR 400

[56] References Cited

U.S. PATENT DOCUMENTS

| | | | |
|---|---|---|---|
| 4,795,722 | 1/1989 | Welch et al. | 437/192 |
| 4,845,054 | 7/1989 | Mitchener | 437/238 |
| 4,952,524 | 8/1990 | Lee et al. | 437/67 |
| 4,999,317 | 3/1991 | Lu et al. | 437/190 |
| 5,317,192 | 5/1994 | Chen et al. | |

FOREIGN PATENT DOCUMENTS

| | | | |
|---|---|---|---|
| 0141496 | 5/1985 | European Pat. Off. | H01L 21/316 |
| O 249 173 | 12/1987 | European Pat. Off. | H01L 21/90 |
| 0488546 | 6/1992 | European Pat. Off. | |
| 5555538 | 10/1978 | Japan. | |
| 5632732 | 8/1979 | Japan. | |
| 5728335 | 7/1980 | Japan. | |
| 199243 | 4/1989 | Japan. | |
| 1135044 | 5/1989 | Japan. | |
| 2144940 | 6/1990 | Japan | 257/760 |
| 3-36727 | 2/1991 | Japan. | |
| 3036727 | 2/1991 | Japan | H01L 21/302 |
| 3194932 | 11/1991 | Japan | H01L 21/302 |
| 4076919 | 3/1992 | Japan | H01L 21/316 |
| 2251722 | 7/1992 | United Kingdom. | |
| WO87/02828 | 5/1987 | WIPO. | |

OTHER PUBLICATIONS

Ghandhi, S., "V.L.S.I. Fabrication Priciples: Silicon and Gallium Arsenide", John Wiley and Sons, pp. 517–519, 1983.

Ghandhi, S., *VLSI Fabrication Principles: Silicon & Gallium Arsenide*, 1983, John Wiley & Sons, pp. 424–426.

Wolf, S., Silicon Processing for the VLSI Era : vol. 2 Process Integration, Lattice Press, 1990, pp. 194–195, 198–199, 229–230, 233–235.

Wolf, S., *Silicon Processing for the VLSI Era: vol. 2 Process Integration*, Lattice Press 1990, p. 236.

"In Situ Planarization of Dielectric Surfaces Using Boron Oxide," 1989 IEEE, VMIC Conference, Jun. 12–13, 1989, J. Marks et al., pp. 89–95.

(List continued on next page.)

*Primary Examiner*—George Fourson
*Attorney, Agent, or Firm*—William S. Francos; John T. Rehberg

[57] ABSTRACT

An integrated circuit and its method of formation are disclosed. The circuit utilizes a spin-on glass as an interlevel dielectric. Above and below the spin-on glass is located a phosphorous doped dielectric. The doped dielectric prevents sodium from becoming mobile under the influence of subsequently applied electric fields.

4 Claims, 1 Drawing Sheet

OTHER PUBLICATIONS

"*An Improved Interlevel Dielectric Process for Submicron Double–Level Metal Products,*" IEEE, VMIC Conference, Jun. 12–13, 1989, S.L.Pennington et al., pp. 355–359.

O. Spindler, B. Neureither—In Situ Planarization of Intermetal Dielectrics: Process Steps, Degree of Planarization and Film Properties—Thin Solid Films, 175 (1989) Aug., No. 1, Lausanne, CH, pp. 67–72.

P.K. Sinha and J.A. Smythe—Moisture and Phosphorous Sensitivity of Sacrificial Spin–On–Glass Dielectric Planarization Process—Journal of the Electrochemical Society, 138 (1991) Mar., No. 3, Manchester, NH, US—pp. 854–856.

J. Kalpathy Cramer and S.P. Murarka—Sodium Passivation Dependence on Phosphorus Concentration in Tetraethylorthosilicate Plasma–enhanced Chemical Vapor Deposited Phosphosilicate Glasses—J. Appl. Phys. 73 (5), Mar. 1, 1993—pp. 2458–2461.

INTEGRATED CIRCUIT DIELECTRIC FORMATION

This application is a continuation application Ser. No. 08/320,309, filed on Oct. 11, 1994, which is a continuation appl. under 37 CFR 1.62 of prior appl. Ser. No. 07/949,417 filed on Sep. 22, 1992, both abandoned.

TECHNICAL FIELD

This invention relates to integrated circuits and methods for their manufacture. More particularly, it relates to dielectrics employed in integrated circuits to provide isolation between electrical conductors.

BACKGROUND OF THE INVENTION

The use of spin-on glasses, including polysiloxanes, polysilicates and silsesquioxanes, is becoming increasingly prevalent in integrated circuit manufacture. Spin-on glasses are easily applied, and may be conveniently planarized with an optimized etch chemistry. Further, spin-on glasses fill small gaps better than many other dielectrics. However, the use of spin-on glass presents a variety of problems in integrated circuit manufacture.

SUMMARY OF THE INVENTION

Applicants have discovered that dielectrics which include spin-on glass that is partially etched back are vulnerable to mobile alkaline ion contamination. Consequently, applicants' process or semiconductor integrated circuit fabrication includes forming a first dielectric layer over a substrate; forming a second layer from the group consisting of spin-on glass and ozone TEOS; performing a process step which tends to introduce mobile ion contamination; and forming a third dielectric layer over the etched second layer. Both the first and third dielectric layers have phosphorous doping. The doped first and third layers help prevent mobile alkaline ion contamination of the underlying substrate. Illustratively, the process which tends to introduce mobile ion contamination may be an etching back of the second layer.

BRIEF DESCRITPION OF THE DRAWING

The FIGURE is a cross-sectional view of a partially fabricated integrated circuit which is helpful in understanding the present invention.

DETAILED DESCRIPTION

Figure 1:
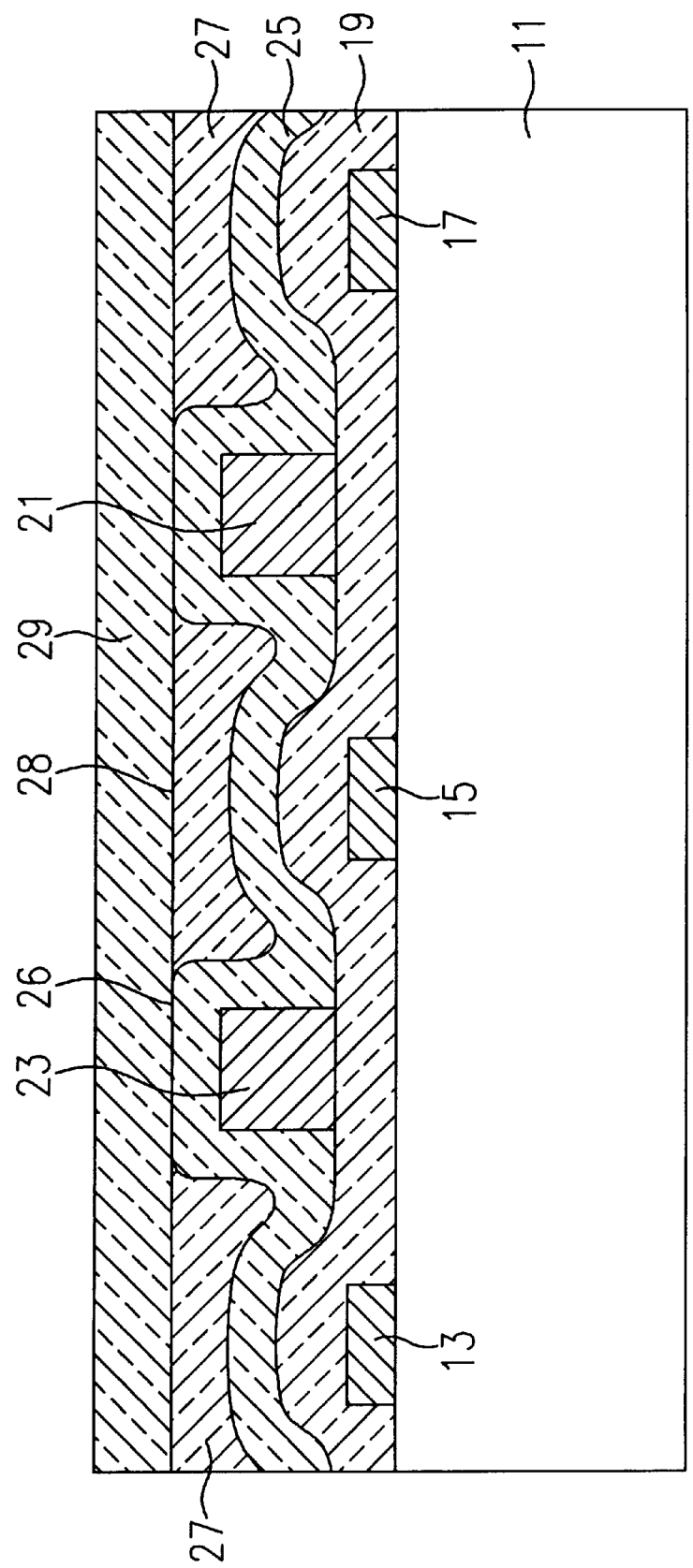

In the FIGURE, reference numeral 11 designates a substrate which may be silicon or silicon dioxide. In general, the term substrate refers to any material having 30 a surface upon which subsequent materials, layers, or structures may be formed. Reference numeral 11 may also represent a field oxide, a thinox region, or alternating field oxide and thinox regions (although not explicitly illustrated as such). Reference numerals 13, 15, and 17 designate topographical features upon substrate 11. Reference numerals 13, 15, and 17 may, for example, be MOS transistor gates or runners. Reference numeral 19 designates a dielectric which surrounds and covers features 13, 15, and 17. Reference numerals 21 and 23 designate topographical features such as conductive runners which may, typically, be made from aluminum, an aluminum alloy, or polysilicon or another conductive material.

Reference numerals 25, 27, and 29, taken together, designate a triple-layer dielectric which serves to encapsulate runners 21 and 23.

Reference numeral 25 is, illustratively, a silicon-dioxide-type dielectric having between 2% and 6% phosphorous by weight. Illustratively, dielectric 25 may be made from TEOS, or silane precursors. Trimethylphosphite (TMP) or phosphine ($PH_3$) may be used as phosphorous dopant sources in the formation of dielectric 25. Dielectric 25 may also be a low temperature oxide. Typically, the thickness of dielectric 25 is 4000–7000 Å.

Dielectric 27 is a spin-on glass material, either a polysiloxane, polysilicate, or a silsesquioxane or ozone TEOS. Dielectric 27 may be applied by conventional techniques and then etched back to form a relatively planar upper surface 28. Upper surface 28 is frequently approximately level or even with the upper surface 26 of layer 25. An etchback step is necessary not only for planarization purposes, but also to remove the spin-on glass from the vicinity of dielectric surfaces such as 26 through which vias may be later opened. (If vias are opened through spin-on glass, moisture may subsequently enter the via and degrade the spin-on glass.) During the plasma etchback, sodium contamination of the upper surfaces 28 of dielectric 27 and upper surface 26 of dielectric 25 frequently occurs. In conventional processing, sodium contamination from plasma etching is frequently removed from the upper oxide surfaces by performing a short wet cleaning procedure in solutions such as 8:1 ethylene glycol:buffered hydrofluoric acid, or 100:1 water and hydrofluoric acid. However, typical wet cleaning procedures (which may be quite suitable for silane or TEOS-based dielectrics) tend to rapidly attack spin-on glass and thus tend to destroy the already-achieved planarization.

Consequently, after spin-on glass 27 is applied and etched back, the wet clean process mentioned above is preferably not performed. Instead, dielectric layer 29 is immediately formed on top of spin-on glass 27. Dielectric 29 may be similar to dielectric 25. That is, dielectric 25 contains between 2% and 6% phosphorous by weight and may be made from TEOS, silane, or may be a low temperature oxide.

Typically, the thickness of dielectric 29 is 4000–7000 Å.

Illustratively, dielectrics 29 and 25 may be formed in an Applied Materials Precision 5000 CVD system. A process chemistry utilizing TEOS, oxygen, and TMP as a phosphorous source may be employed. Wafer temperature is maintained at 390° C., well below the critical temperature of 410–420° C. for aluminum metalization. The plasma CVD reactor is operated at 2.0 to 9.0 Torr, with 200–1000 watts of RF power at 13.56 MHz.

Applicants have found that doping either the top or the bottom layer (i.e., layer 29 or 25) alone is not effective in preventing alkaline ion motion under the influence of electric fields. Both layers 29 and 25 are preferably doped. The phosphorous in layers 29 and 25, it is hypothesized, ties up or getters the mobile alkaline ions, thus preventing degradation of the ultimately formed integrated circuits.

What is claimed is:

1. A method of integrated circuit fabrication, comprising:

forming a first dielectric over runners which overlie a substrate, said first dielectric containing more than four percent and up to six percent phosphorous by weight;

forming a second dielectric layer;

etching back said second dielectric layer to expose at least one portion of said first dielectric layer; said runners remaining covered; and forming a third dielectric layer over said second dielectric layer containing more than four percent and up to six percent phosphorous by weight.

2. A method as recited in claim 1, wherein said first and said third dielectric layers are silicon-dioxide.

3. A method as recited in claim 1, wherein said second dielectric layer is spin-on-glass.

4. A method as recited in claim 2, wherein said first and third dielectric layers have a thickness in the range of 4000–7000 Å.

* * * * *